United States Patent [19]
Kanekal et al.

[11] Patent Number: 5,923,621
[45] Date of Patent: Jul. 13, 1999

[54] CLOCK DOUBLER CIRCUIT WITH DUTY CYCLE CONTROL

[75] Inventors: Hemanth G. Kanekal; Narasimha Nookala, both of San Jose, Calif.

[73] Assignee: Cirrus Logic, Inc., Fremont, Calif.

[21] Appl. No.: 08/966,666

[22] Filed: Nov. 10, 1997

Related U.S. Application Data

[63] Continuation of application No. 08/476,715, Jun. 7, 1995.

[51] Int. Cl.$^6$ ........................................................ G04F 8/00
[52] U.S. Cl. ............................................ 368/117; 368/120

[56] References Cited

U.S. PATENT DOCUMENTS

| | | | |
|---|---|---|---|
| 4,397,022 | 8/1983 | Weng et al. | 371/37 |
| 4,980,577 | 12/1990 | Baxter | 307/272 |
| 4,984,195 | 1/1991 | Nakamura et al. | 364/200 |
| 5,590,316 | 12/1996 | Hausauer | 395/556 |

*Primary Examiner*—Bernard Roskoski
*Attorney, Agent, or Firm*—Victor H. Okumoto; Frank D. Nguyen

[57] ABSTRACT

A clock doubler circuit with duty cycle control includes an exclusive-OR, a toggle flip-flop, a plurality of control bit flip-flops, a primary delay element, a plurality of secondary delay elements, and a multiplexer. The toggle flip-flop has a clock input connected to an output of the exclusive-OR, and an inverted data output connected back to a data input of the toggle flip-flop and connected forward to an input of the primary delay element. An output of the primary delay element is connected to an input of the multiplexer and to individual inputs of the plurality of secondary delay elements which in turn, have outputs connected to other inputs of the multiplexer. A plurality of control bits generated, for example, by a computer program running on a host processor, are respectively provided to data inputs of the plurality of control bit flip-flops which in turn, have data outputs connected to select inputs of the multiplexer. The plurality of control bits thereupon causes the multiplexer to selectively pass one of the outputs of the primary delay element or plurality of secondary elements as its output. The exclusive-OR logically combines a system clock signal and the output of the multiplexer to generate a clock signal at twice the frequency of the system clock signal and duty cycle as determined by the control bits and the delays of the primary delay element and the plurality of secondary delay elements.

10 Claims, 8 Drawing Sheets fig.1

*fig.2a*

*fig.2b* fig.3 fig.4 fig.5 fig.6 fig.7a fig.7b fig.7c

CLOCK DOUBLER CIRCUIT WITH DUTY CYCLE CONTROL

This application is a continuation of application Ser. No. 08/476,715, filed Jun. 7. 1995.

BACKGROUND OF THE INVENTION

This invention relates in general to clock doubler circuits and in particular, to a clock signal frequency doubler circuit with externally selectable duty cycle control.

Clock doubler circuits are particularly useful in computer systems requiring two or more clock signals of different frequencies. For example, a memory controller interfacing with a dynamic random-access-memory ("DRAM") typically needs control signals that run at twice the frequency of a system clock. Accordingly, computer systems employing such memory controllers require at least two clock signals, the system clock signal and another clock signal running at twice the frequency of the system clock signal.

There are many well known techniques for generating two or more clock signals of different frequencies from a single clock signal. A first type of techniques starts with the highest frequency clock signal and generates the other clock signals from the highest frequency clock signal using, for example, frequency dividers. For example, a computer system using one of these first type of techniques may receive a clock signal that is twice the frequency of a system clock signal, and generate the system clock signal by passing the received signal through a divide-by-two frequency divider included in the computer system.

Conversely, a second type of techniques starts with a lower or the lowest frequency clock signal and generates the higher frequency clock signals from the lower frequency clock signal using, for example, phase-locked-loop circuits. For example, a computer system using one of these second type of techniques may receive the system clock signal, and generate a clock signal that is twice the frequency of the system clock signal by passing the received system clock signal through a phase-locked-loop circuit included in the computer system. Although the second type of techniques may be preferable for system design, they are also generally more difficult to implement.

When generating a clock signal that is twice the frequency of a system clock signal from the system clock signal, it may also be desirable to be able to vary the duty cycle of the generated clock signal. For example, in certain applications it may be desirable to generate a clock signal that is not only twice the frequency of a system clock signal, but also has a 50% duty cycle. In other applications, it may be desirable to generate a clock signal having 40% or 60% duty cycles. In addition, it may be desirable to control such duty cycle variation from a source such as a host processor, which is separate or external from the clock generation circuit that generates the clock signal that is twice the frequency of a system clock signal from the system clock signal.

OBJECTS AND SUMMARY OF THE INVENTION

Accordingly, one object of the present invention is a clock doubler circuit which generates a clock signal that is twice the frequency of a system clock signal from the system clock signal.

Another object of the present invention is a clock doubler circuit that is simple to implement in an integrated circuit, and cost effective to manufacture.

Still another object of the present invention is a clock doubler circuit which generates a variable duty cycle clock signal that is twice the frequency of a system clock signal from the system clock signal.

These and other objects are accomplished by the various aspects of the present invention, wherein briefly stated, one aspect of the present invention is a clock circuit for generating a second clock signal having twice the frequency of a first clock signal, comprising: an exclusive-OR circuit having first and second inputs, and an output, the first clock signal connected to the first input of the exclusive-OR circuit; and delay means responsive to a signal generated at the output of the exclusive-OR circuit, for generating a delayed version of the signal generated at the output of the exclusive-OR circuit, and providing the delayed version of the signal to the second input of the exclusive-OR circuit such that the second clock signal is generated at the output of the exclusive-OR circuit.

In its preferred embodiment, the delay means of the clock circuit includes a flip-flop, a primary delay element, a plurality of secondary delay elements, and a multiplexer means. The flip-flop has a clock input connected to the output of the exclusive-OR circuit, an inverted data output connected back to a data input of the flip-flop and connected to an input of the primary delay element. The output of the primary delay element is connected to an input of the multiplexer means, and to individual ones of a plurality of secondary delay elements. The outputs of the plurality of secondary delay elements are connected to corresponding inputs of the multiplexer means. A plurality of control bits generated by a computer program running on a host processor, for example, causes a signal on one of the inputs to the multiplexer means to be selectively passed to an output of the multiplexer means. The output of the multiplexer means acts as the output of the delay means, and is connected to the second input of the exclusive-OR circuit.

Another aspect of the present invention is a computer system comprising: a host processor; at least one device connected to the host processor through a system bus; and means for controlling traffic on the system bus. The traffic controlling means includes a clock circuit for generating a second clock signal having twice the frequency of a first clock signal. The clock circuit comprises an exclusive-OR circuit having first and second inputs, and an output, the first clock signal connected to the first input of the exclusive-OR circuit, and delay means responsive to a signal generated at the output of the exclusive-OR circuit, for generating a delayed version of the signal generated at the output of the exclusive-OR circuit, and providing the delayed version of the signal to the second input of the exclusive-OR circuit such that the second clock signal is generated at the output of the exclusive-OR circuit.

Another aspect of the present invention is a method of generating a second clock signal having twice the frequency of a first clock signal, comprising: generating a delayed version of the first clock signal; and exclusive-ORing the first clock signal with the delayed version of the first clock signal to generate the second clock signal. In its preferred mode, the delayed version of the first clock signal generating step comprises: generating a first plurality of delayed versions of the first clock signal of incrementally increasing delays, and selecting one of the plurality of delayed versions of the first clock signal as the delayed version of the first clock signal to be exclusive-ORed with the first clock signal.

Still another aspect of the present invention is a method of generating a second clock signal having twice the frequency of a first clock signal, comprising: connecting the first clock signal to a first input of an exclusive-OR circuit; connecting an output of the exclusive-OR circuit to a clock input of a flip-flop; connecting an inverted data output of the flip-flop to a data input of the flip-flop and to an input of a delay circuit; and connecting an output of the delay circuit to a second input of the exclusive-OR circuit such that the second clock signal is generated at the output of the exclusive-OR circuit. In its preferred mode, the method further comprises forming the delay circuit by connecting the inverted data output of the flip-flop to an input of a primary delay element, connecting an output of the primary delay element to inputs of a plurality of secondary delay elements, and connecting outputs of the primary delay element and the plurality of secondary delay elements to corresponding inputs of a multiplexer circuit such that a selected one of the outputs of the primary delay element and the plurality of secondary delay elements is passed through the multiplexer circuit to be the output of the delay circuit.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
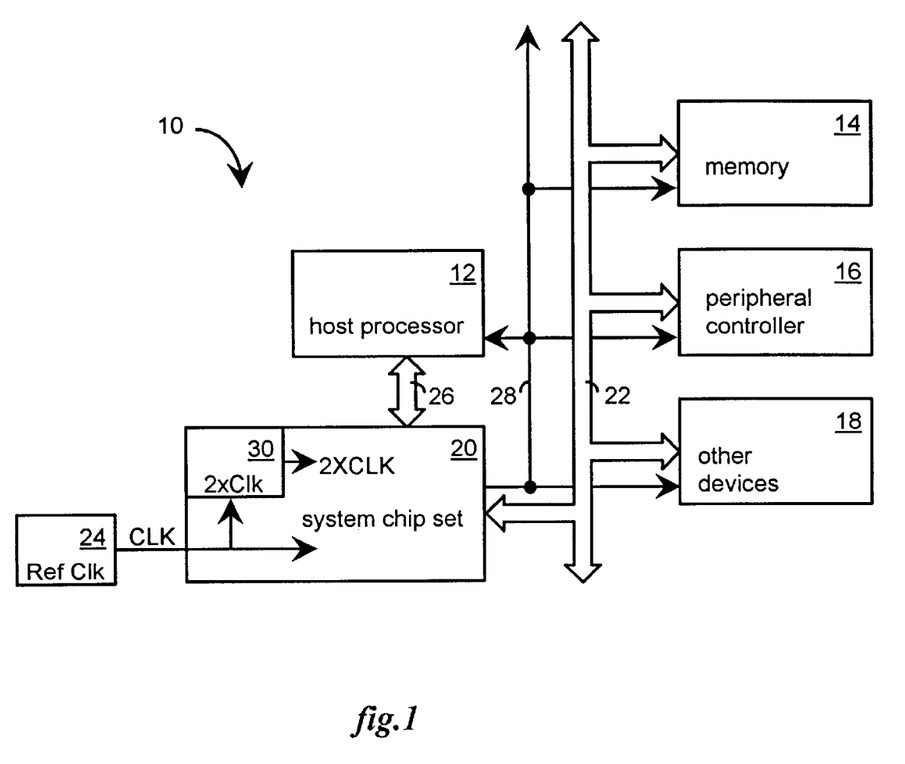
FIG. 1 illustrates, as an example, a block diagram of a computer system including a clock doubler circuit utilizing aspects of the present invention.

FIG. 1 illustrates, as an example, a block diagram of a computer system 10. Included in the computer system 10 are a host processor 12, a memory 14, a peripheral controller 16, and a block designated as other devices 18. The host processor 12 may be any one of a number of commercially available microprocessors such as those marketed by Intel and Motorola. The memory 14, the peripheral controller 16, and the other devices 18 communicate with the host processor 12 over a system bus 22 under the control of a system chip set 20. Although the host processor 12 is shown communicating to the system chip set 20 through a separate bus 26, it is also contemplated to be within the scope of the present invention to include computer systems where the host processor 12 communicates with the system chip set 20 through the system bus 22.

In addition to controlling the traffic on the system bus 22, the system chip set 20 also includes a doubler circuit 30 which generates a clock signal 2XCLK which is twice the frequency of a system clock signal CLK received from a reference clock circuit 24. The system clock signal CLK is then provided to the host processor 12, the memory 14, the peripheral controller 16, and the other devices 18 through clock lines 28, and the generated clock signal 2XCLK may also if desirable be provided to the host processor 12, the memory 14, the peripheral controller 16, and the other devices 18 through clock lines 28.

Figure 2A:
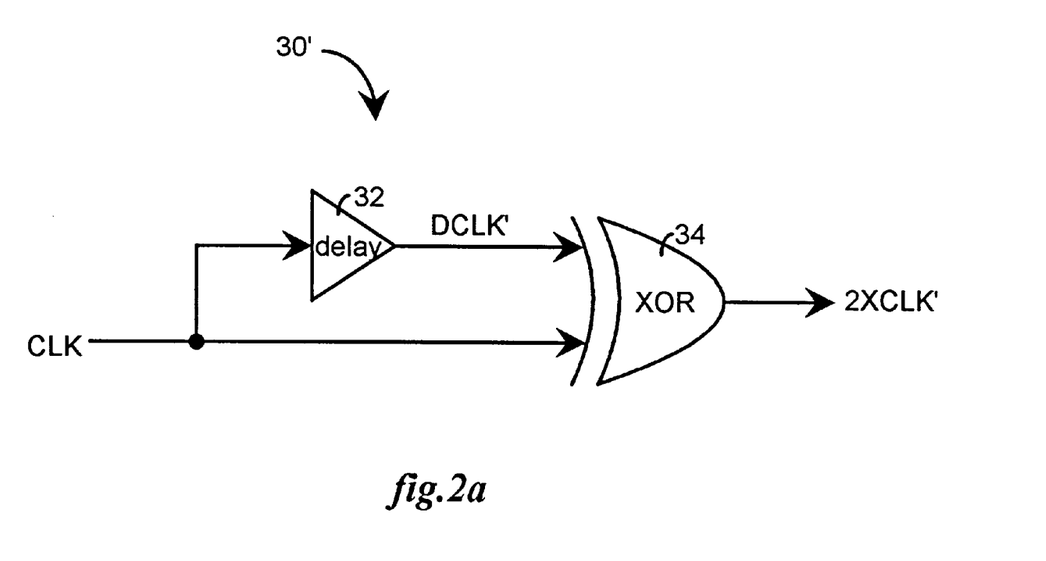
FIGS. 2a and 2b respectively illustrate, as examples, a simplified logic diagram of a clock doubler circuit utilizing aspects of the present invention, and timing diagrams related to the clock doubler circuit.
Figure 2B:
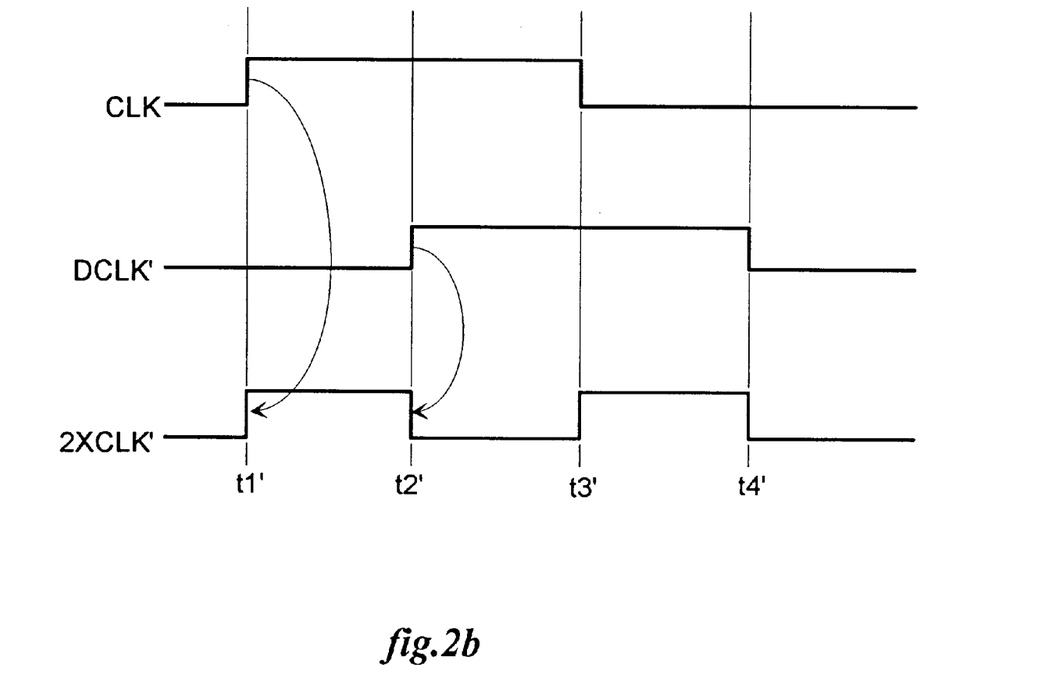

FIGS. 2a and 2b respectively illustrate, as examples, a clock doubler circuit 30', and timing diagrams related to the clock doubler circuit 30'. In FIG. 2a, the clock doubler circuit 30' is shown to include a delay element 32 and an exclusive-OR circuit 34. The delay element 32 has an input receiving an incoming or system clock signal CLK, and an output providing a delayed version DCLK' of the incoming or system clock signal CLK. The exclusive-OR circuit 34 has a first input also receiving the incoming or system clock signal CLK, a second input connected to the output of the delay element 32 to receive the delayed version DCLK' of the incoming or system clock signal CLK, and an output providing a clock signal 2XCLK' which is twice the frequency of the incoming or system clock signal CLK. In FIG. 2b, the general operation of the clock doubler circuit 30' is shown in terms of timing diagrams related to the clock doubler circuit 30'. At a time t1', with a rising edge of the incoming or system clock signal CLK occurring and the output of the delay element 32 initially set to zero by conventional means, the first and second inputs to the exclusive-OR circuit 34 are of different logic states and as a result, the output of the exclusive-OR circuit 34 goes to a logic HIGH. At a time t2', with a rising edge of the delayed version DCLK' of the incoming or system clock signal CLK occurring and the incoming or system clock CLK still being logic HIGH, the first and second inputs to the exclusive-OR circuit 34 are of the same logic states and as a result, the output of the exclusive-OR circuit 34 goes to a logic LOW. At a time t3', with a falling edge of the incoming or system clock signal CLK occurring and the delayed version DCLK' of the incoming or system clock CLK still being logic HIGH, the first and second inputs to the exclusive-OR circuit 34 are once again of different logic states and as a result, the output of the exclusive-OR circuit 34 goes to a logic HIGH. At a time t4', with a falling edge of the delayed version DCLK' of the incoming or system clock CLK occurring and the incoming or system clock signal CLK still being logic LOW, the first and second inputs to the exclusive-OR circuit 34 are once again of the same logic states and as a result, the output of the exclusive-OR circuit 34 goes to a logic LOW. The pattern described at times t1' to t4' thereupon repeats for each subsequent cycle of the incoming or system clock signal CLK.

By varying the delay of the delay element 32, the duty cycle of the clock signal 2XCLK' generated at the output of the exclusive-OR circuit 34 can be varied. For example, as shown in FIG. 2b, if the delay is one quarter the period of the incoming or system clock signal CLK, then the clock signal 2XCLK' generated at the output of the exclusive-OR circuit 34 has a 50% duty cycle and twice the frequency of the incoming or system clock signal CLK. On the other hand, if the delay is less than one-quarter the period of the incoming or system clock signal CLK, then the clock signal 2XCLK' generated at the output of the exclusive-OR circuit 34 has a duty cycle less than 50%, and if the delay is greater than one-quarter and less than one-half the period of the incoming or system clock signal CLK, then the clock signal 2XCLK' generated at the output of the exclusive-OR circuit 34 has a duty cycle greater than 50%.

One problem with the clock doubler circuit 30' is that when the delay of the delay element 32 is half the period of the incoming or system clock signal CLK (i.e., 180° out of phase), the clock signal 2XCLK' generated at the output of the exclusive-OR circuit 34 is not a clock signal having twice the frequency of the incoming or system clock signal CLK, but a DC signal having a constant logic HIGH state. Consequently, the clock doubler circuit 30' fails to perform properly under this condition.

Another problem with the clock doubler circuit 30' is that the delay of the delay element 32 may vary as the result of second order effects such as caused by variations in temperature and ground reference voltage and as a result, the duty cycle of the clock signal 2XCLK' generated at the output of the exclusive-OR circuit 34 may vary accordingly in divergence from a desired duty cycle.

Figure 3:
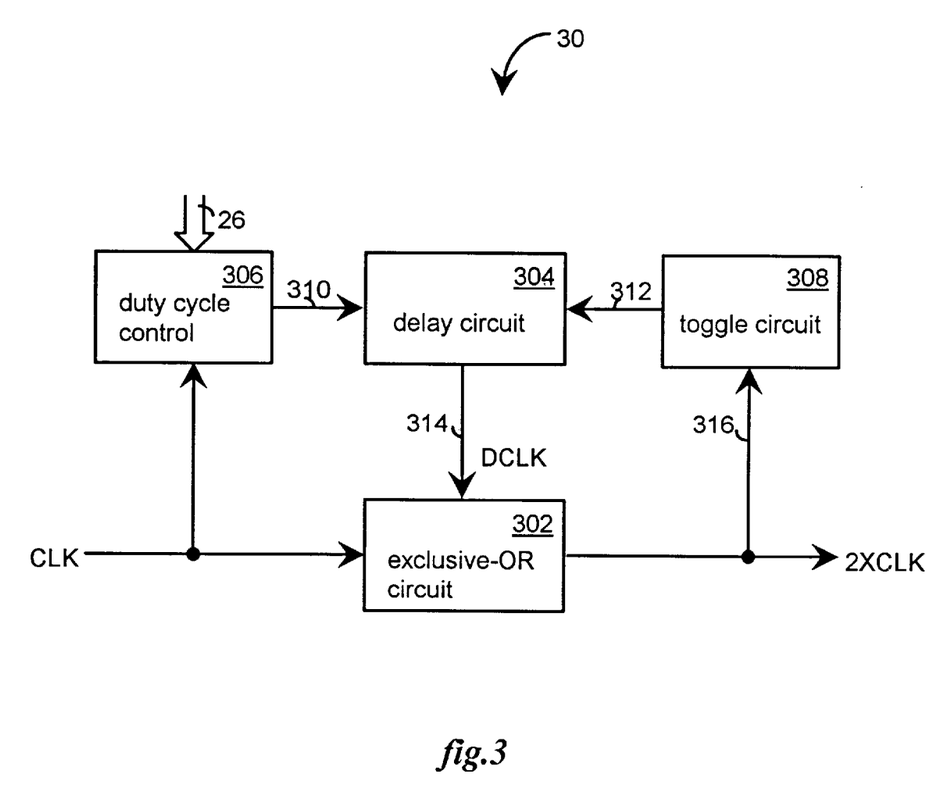
FIG. 3 illustrates, as an example, a block diagram of a clock doubler circuit utilizing aspects of the present invention.

FIG. 3 illustrates, as an example, a block diagram of a preferred clock doubler circuit 30 which avoids the above stated problems in reference to the clock doubler circuit 30' while taking advantage of the simplicity in design of the clock doubler circuit 30'. Included in the clock doubler circuit 30 are an exclusive-OR circuit 302, a toggle circuit 308, a delay circuit 304, and a duty cycle control circuit 306. The exclusive-OR circuit 302 is of conventional operation and construction well known in implementing exclusive-OR gates. As connected in FIG. 3, the exclusive-OR circuit 302 receives the incoming or system clock signal CLK and a delayed version DCLK of the incoming or system clock signal CLK from the delay circuit 304, and generates in response thereof, a clock signal 2XCLK which is generally twice the frequency of the incoming or system clock signal CLK.

Figure 4:
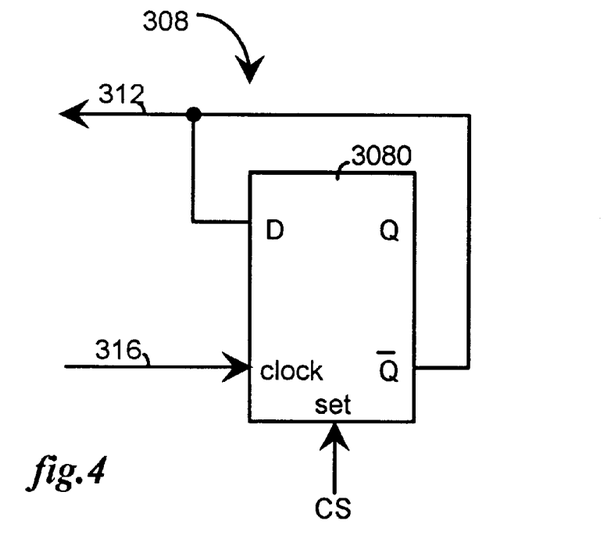
FIG. 4 illustrates, as an example, a toggle circuit useful in the clock doubler circuit of FIG. 3.

FIG. 4 illustrates, as an example, an implementation of the toggle circuit 308 of FIG. 3. The heart of the toggle circuit 308 is a positive edge triggered "D" type flip-flop 3080 (also referred to herein as a toggle flip-flop). The "D" type flip-flop 3080 has a clock input connected via line 316 to the output of the exclusive-OR circuit 302, an inverted data output Q-bar connected back to a data input D of the "D" type flip-flop 3080, and a set input connected to a control signal CS generated, for example, at a power up condition by a power up circuit (not shown) in the system chip set 20. Preferably, the inverted data output Q-bar is initially set to a logic LOW or "0" when the "D" type flip-flop 3080 is set by the control signal CS.

Figure 5:
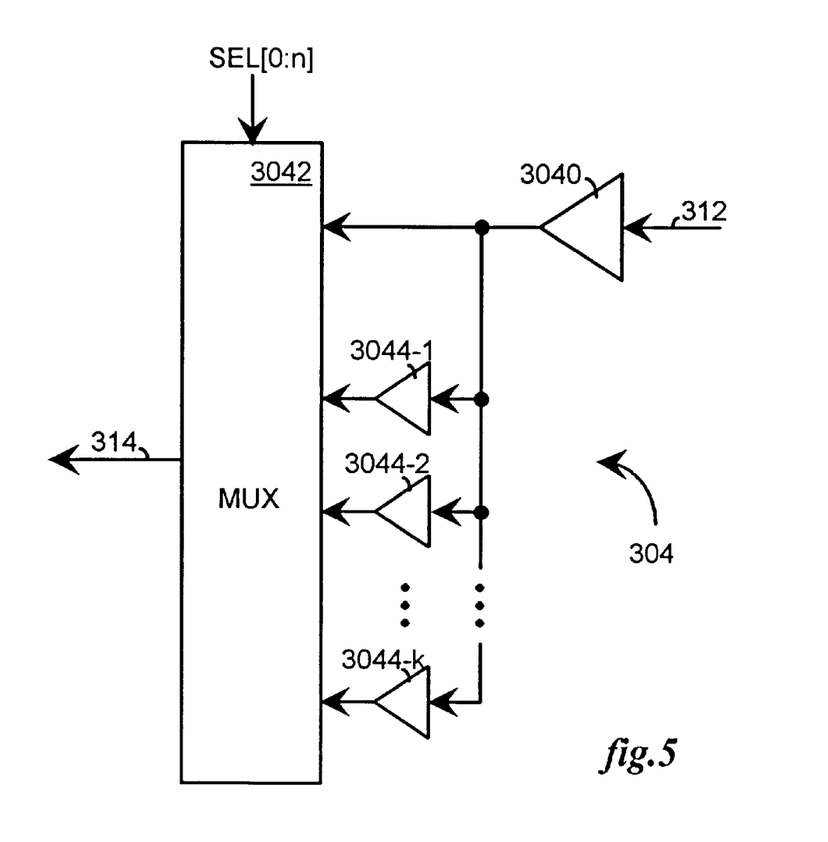
FIG. 5 illustrates, as an example, a delay circuit useful in the clock doubler circuit of FIG. 3.

FIG. 5 illustrates, as an example, an implementation of the delay circuit 304 of FIG. 3. Included in the delay circuit 304 are a primary delay element 3040, a plurality of secondary delay elements 3044-1 to 3044-k, and a multiplexer circuit 3042. The primary delay element 3040 and the plurality of secondary delay elements, 3044-1 to 3044-k, are preferably buffers of conventional construction having designed for delay times. In a preferred embodiment, the number of the plurality of secondary delay elements, 3044-1 to 3044-k, is odd (e.g., $2^{(n+1)}-1$, where n=number of select control bits), and the delay times of the plurality of secondary delay elements, 3044-1 to 3044-k, incrementally increase in sequence such as in the following equation:

$$dt_i = i * \Delta t, \quad i=1, 2, \ldots k \quad (1)$$

where $\Delta t$ is a fixed incremental delay value. Preferably, the sum of the delay times of the primary delay element 3040 and a middle one of the secondary delay elements 3044-((k+1)/2) is equal to one-quarter of the period of the incoming or system clock signal CLK.

The primary delay element 3040 has an input connected via line 312 to the inverted data output Q-bar of the "D" type flip-flop 3080, and an output connected to individual inputs of the plurality of secondary delay elements, 3044-1 to 3044-k. A multiplexer circuit 3042 has a plurality of inputs respectively connected to the output of the primary delay element 3040 and individual outputs of the plurality of secondary delay elements, 3044-1 to 3044-k, a plurality of select inputs SEL[0:n], and an output providing along a line 314 the delayed version DCLK of the incoming or system clock signal CLK by passing one of the outputs of the primary delay element 3040 or the plurality of secondary delay elements, 3044-1 to 3044-k, to its output in response to the select inputs SEL[0:n]. For example, if the number of secondary delay elements is 3, then a select input of "00" would pass the output of the primary delay element 3040 to the output of the multiplexer circuit 3042, a select input of "01" would pass the output of the first secondary delay element 3044-1 to the output of the multiplexer circuit 3042, a select input of "10" would pass the output of the second secondary delay element 3044-2 to the output of the multiplexer circuit 3042, and a select input of "11" would pass the output of the third secondary delay element 3044-3 to the output of the multiplexer circuit 3042. For a larger number of secondary delay elements, larger multiplexer circuits and more select bits would be required. It is to be appreciated that finer control on the duty cycle of the clock signal 2XCLK is generally achieved by adding more secondary delay elements to the delay circuit 304.

Figure 6:
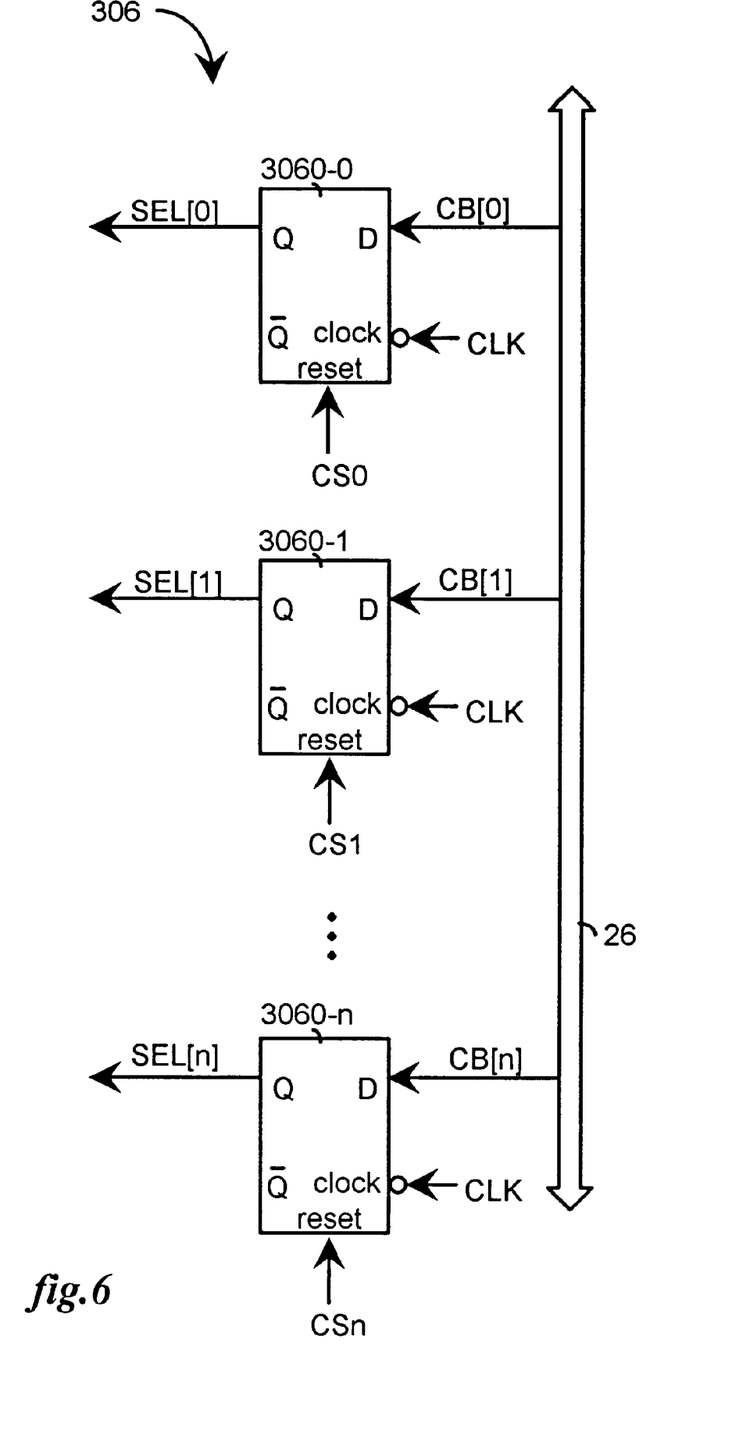
FIG. 6 illustrates, as an example, a duty cycle control circuit useful in the clock doubler circuit of FIG. 3.

FIG. 6 illustrates, as an example, an implementation of the duty cycle control circuit 306 of FIG. 3. Included in the duty cycle control circuit 306 are a plurality of negative edge triggered "D" type flip-flops, 3060-0 to 3060-n, (also referred to herein as control bit flip-flops) individually having a data input D, a clock input, a reset input, and a data output Q. Preferably, the individual clock inputs of the "D" type flip-flops, 3060-0 to 3060-n, are connected to the incoming or system clock signal CLK, the individual data inputs of the "D" type flip-flops, 3060-0 to 3060-n, respectively receive corresponding control bits, CB[0] to CB[n], from the host processor 12 via the bus 26 and qualified accordingly, and the individual reset inputs of the "D" type flip-flops, 3060-0 to 3060-n, are connected to the control signal CS (which is also connected to the reset input of the toggle flip-flop 3080 of the toggle circuit 308). The individual data outputs of the "D" type flip-flops, 3060-0 to 3060-n, thereupon provide the select inputs SEL[0:n] to the multiplexer circuit 3042 of the delay circuit 304 such that they reflect corresponding values of the control bits, CB[0] to CB[n].

Figure 7A:
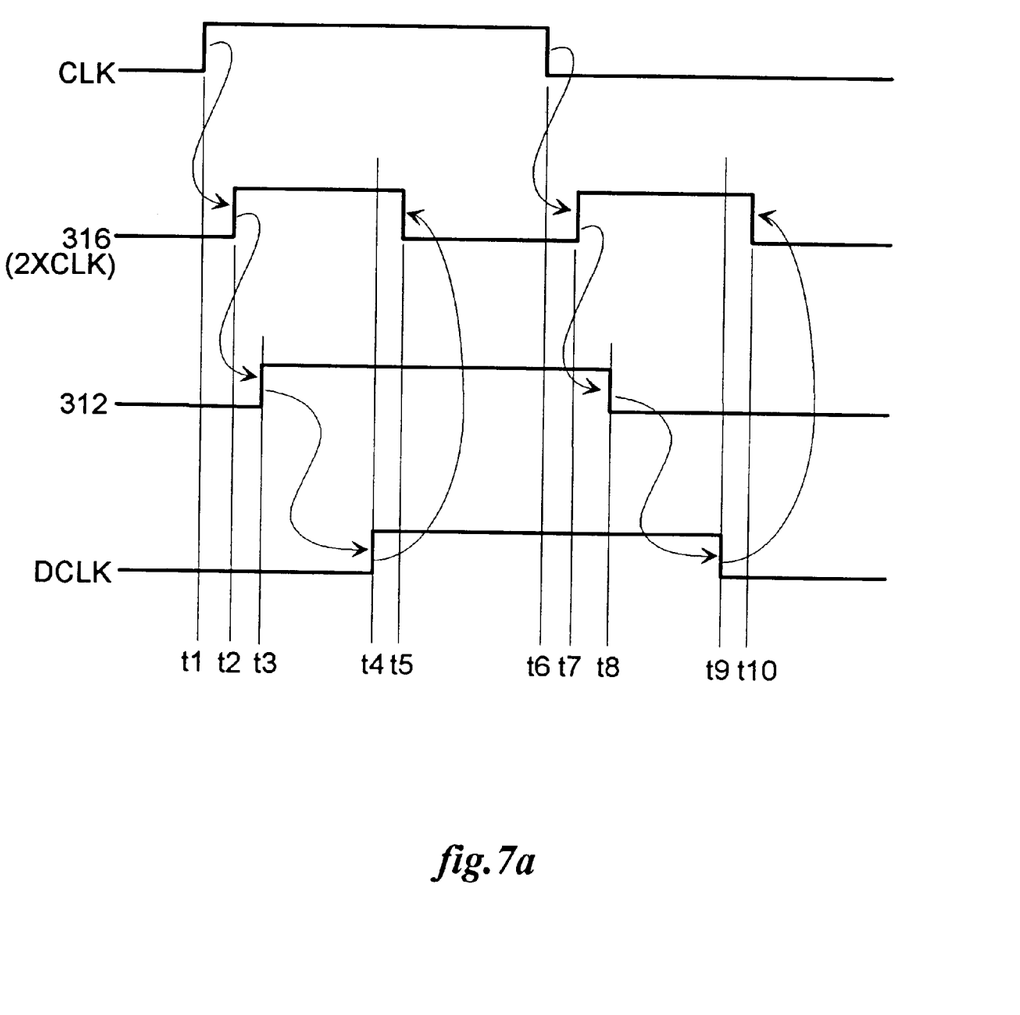
FIGS. 7a–7c respectively illustrate, as examples, timing diagrams related to three different delays through the delay circuit of the clock doubler circuit of FIG. 3.
Figure 7B:
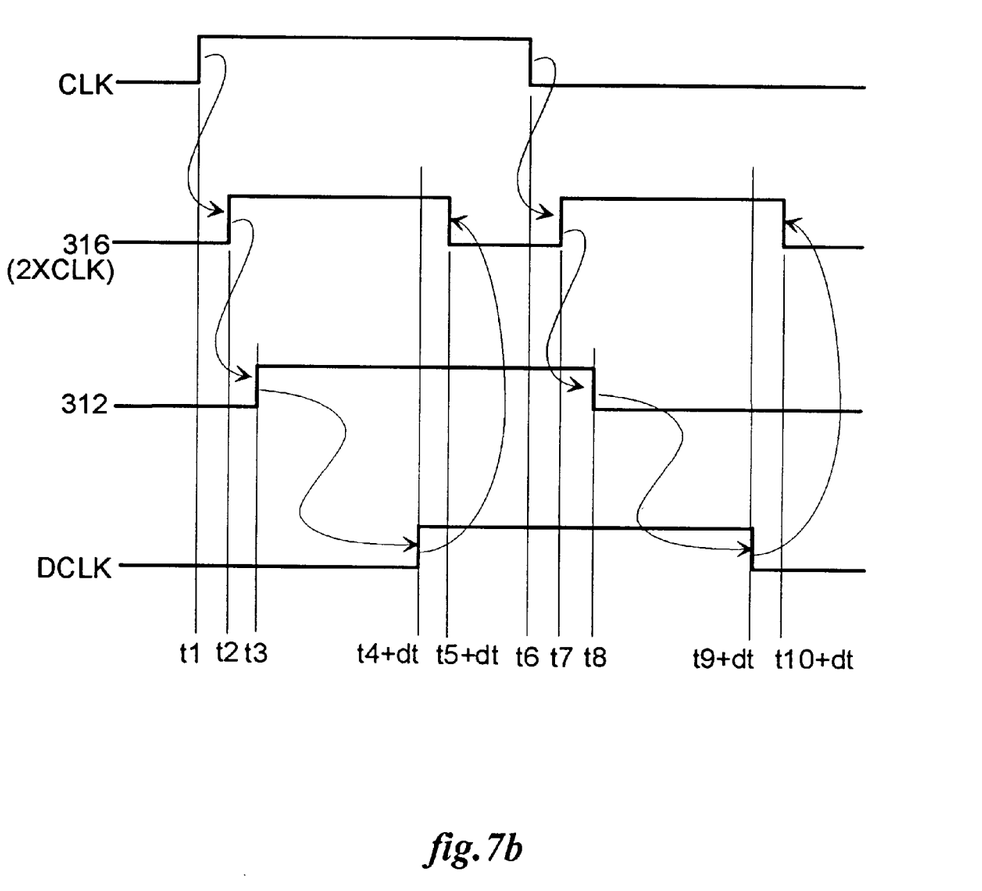
Figure 7C:
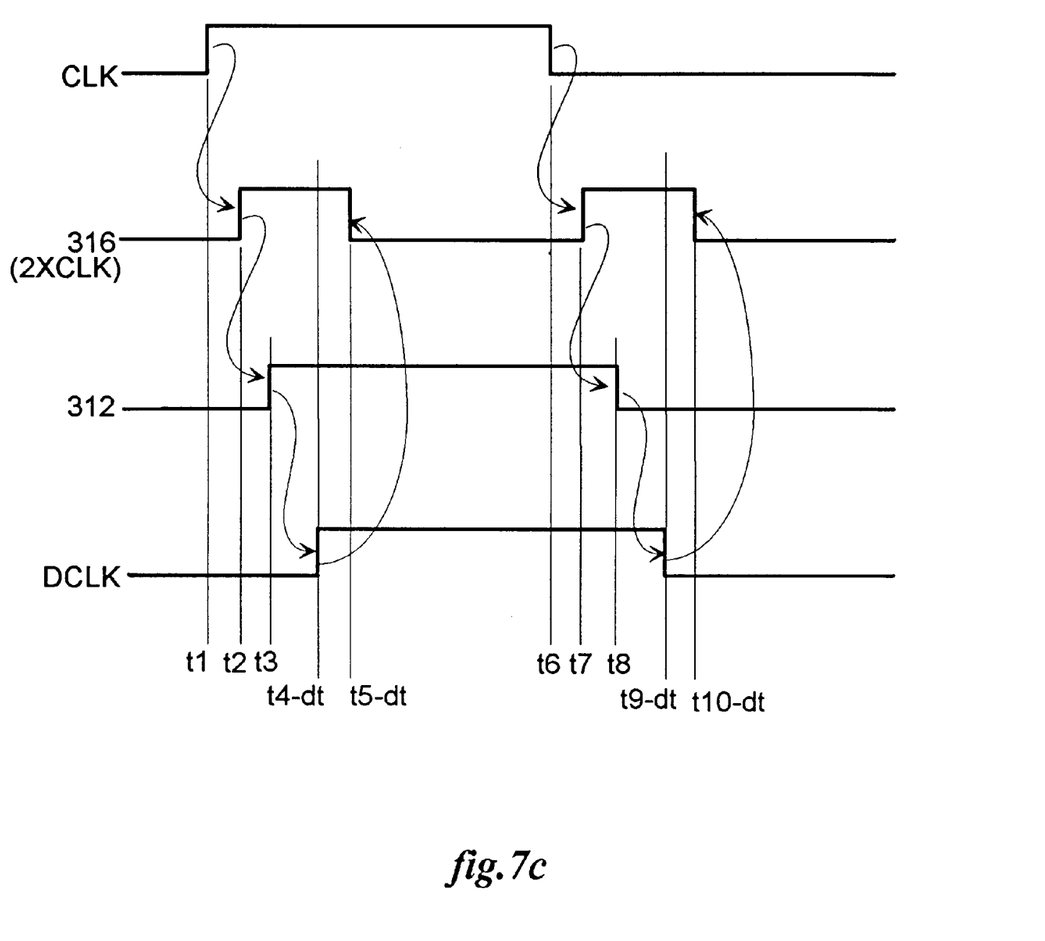

FIGS. 7a–7c respectively illustrate, as examples, timing diagrams related to three different delays through the delay circuit 304. In particular, FIG. 7a illustrates an example where the delay through the delay circuit 304 is equal to a quarter period of the incoming or system clock signal CLK, FIG. 7b illustrates an example where the delay through the delay circuit 304 is greater than a quarter period of the incoming or system clock signal CLK, and FIG. 7c illustrates an example where the delay through the delay circuit 304 is less than a quarter period of the incoming or system clock signal CLK.

Referring first to FIG. 7a, at time t1, a rising edge of the incoming or system clock signal CLK occurs, and the exclusive-OR circuit 302 logically combines the incoming or system clock signal CLK with the output DCLK of the delay circuit 304 which is initially at a logic LOW state. According to the logic of an exclusive-OR as summarized in the following table I,

TABLE I

| CLK | DCLK | 2XCLK |
|---|---|---|
| 1 | 0 | 1 |
| 1 | 1 | 0 |
| 0 | 1 | 1 |
| 0 | 0 | 0 | the output on line 316 of the exclusive-OR circuit 302 thereupon goes to a logic HIGH state at a time t2 after a propagation delay (t2–t1) through the exclusive-OR circuit 302. The toggle circuit 308 then responds to the rising edge of the output on line 316 of the exclusive-OR circuit 302 to switch at a time t3 from its initial logic LOW state to a logic HIGH state after a propagation delay (t3–t2) through the toggle circuit 308. After a delay (t4–t3) determined by the control bits, CB[0] to CB[n], the delay circuit 304 passes as its output DCLK at a time t4 the logic HIGH state generated at time t3 by the toggle circuit 308. According to the logic of an exclusive-OR as summarized in table I, the exclusive-OR circuit 302 thereupon logically combines the HIGH incoming or system clock signal CLK with the logic HIGH state of the DCLK output of the delay circuit 304 to generate an output on line 316 which goes to a logic LOW state at a time t5 after a propagation delay (t5–t4) through the exclusive-OR circuit 302. At time t6, a falling edge of the incoming or system clock signal CLK occurs, and the exclusive-OR circuit 302 logically combines the LOW incoming or system clock signal CLK with the still HIGH output DCLK of the delay circuit 304. According to the logic of an exclusive-OR as summarized in table I, the exclusive-OR circuit 302 thereupon logically combines the LOW incoming or system clock signal CLK with the logic HIGH state of the DCLK output of the delay circuit 304 to generate an output on line 316 which goes to a logic HIGH state at a time t7 after a propagation delay (t7–t6) through the exclusive-OR circuit 302. The toggle circuit 308 then responds to the rising edge of the output on line 316 of the exclusive-OR circuit 302 to switch at a time t8 from its logic HIGH state to a logic LOW state after a propagation delay (t8–t7) through the toggle circuit 308. After a delay (t9–t8) determined by the control bits, CB[0] to CB[n], the delay circuit 304 passes as its output DCLK at a time t9 the logic LOW state generated at time t8 by the toggle circuit 308. According to the logic of an exclusive-OR as summarized in table I, the exclusive-OR circuit 302 thereupon logically combines the LOW incoming or system clock signal CLK with the logic LOW state of the DCLK output of the delay circuit 304 to generate an output on line 316 which goes to a logic LOW state at a time t10 after a propagation delay (t10–t9) through the exclusive-OR circuit 302. On subsequent periods of the incoming or system clock signal CLK, the pattern described in reference to times t1–t10 repeats.

Referring now to FIGS. 7b and 7c, examples where the delay through the delay circuit 304 is respectively greater than a quarter period of the incoming or system clock signal CLK, and less than a quarter period of the incoming or system clock signal CLK are shown. As can be seen from FIG. 7b, when the delay through the delay circuit 304 is greater than a quarter period of the incoming or system clock signal CLK, the duty cycle of the resulting clock signal 2XCLK is correspondingly greater than 50%. Conversely, as can be seen from FIG. 7c, when the delay through the delay circuit 304 is respectively less than a quarter period of the incoming or system clock signal CLK, the duty cycle of the resulting clock signal 2XCLK is correspondingly less than 50%.

It is to be appreciated from FIGS. 7a–7c that the duty cycle of the clock signal 2XCLK can be varied by selectively passing through the multiplexer circuit 3042 as the delayed version DCLK of the incoming or system clock signal CLK, different outputs of the primary delay element 3040 or the plurality of secondary delay elements, 3044-1 to 3044-k. In particular, if the duty cycle of the clock signal 2XCLK is less than or greater than 50% due to second order effects such as caused by variations in temperature and ground reference voltage, appropriate control bits, CB[0] to CB[n], can be generated to respectively cause more delay in the delay circuit 304 or less delay in the delay circuit 304 as appropriate to generate a revised clock signal 2XCLK having a 50% duty cycle.

Although the various aspects of the present invention have been described with respect to a preferred embodiment, it will be understood that the invention is entitled to full protection within the full scope of the appended claims.

What is claimed is:

1. A clock circuit with duty cycle control for generating a second clock signal having twice the frequency of a first clock signal, comprising:

an exclusive-OR circuit having a first input, a second input, and an output, wherein said first clock signal is coupled to said exclusive-OR first input;

a flip-flop having a data input, a clock input, and an inverted data output, wherein said exclusive-OR output is coupled to said flip-flop clock input, and said flip-flop inverted data output is coupled to said flip-flop data input; and a variable delay circuit having an input, at least one select input, and an output, wherein said flip-flop inverted data output is coupled to said variable delay circuit input, at least one select bit is coupled to said at least one select input, and said variable delay circuit output is coupled to said exclusive-OR second input, such that said exclusive-OR output provides a second clock signal having twice the frequency of said first clock signal and a duty cycle indicative of said at least one select bit.

2. The clock circuit according to claim 1, wherein said variable delay circuit comprises a primary delay element coupled between said flip-flop inverted data output and said exclusive-OR second input, and a plurality of secondary delay elements selectably connected in response to said at least one select bit, to said primary delay element and between said flip-flop inverted data output and said exclusive-OR second input.

3. The clock circuit according to claim 1, wherein said plurality of secondary delay elements are organized by sequentially increasing delay times, and individually having an input and an output, said input connected to an output of said primary delay element, and said variable delay circuit further comprises a multiplexer circuit connected to an output of said primary delay element and said outputs of said plurality of secondary delay elements, for passing an output of a selected one of said primary delay element and said plurality of secondary delay elements to said exclusive-OR second input in response to said at least one select bit.

4. A computer system comprising:

a processor;

at least one device connected to said processor through a system bus; and a traffic control mechanism connected with said bus, said traffic control mechanism including a clock circuit with duty cycle control for generating a second clock signal which is substantially a multiple of the frequency of a first clock signal, wherein said clock circuit comprises an exclusive-OR circuit having a first input, a second input, and an output, wherein said first clock signal is coupled to said exclusive-OR first input, a flip-flop having a data input, a clock input, and an inverted data output, wherein said exclusive-OR output is coupled to said flip-flop clock input, and said flip-flop inverted data output is coupled to said flip-flop data input: and a variable delay circuit having an input, at least one select input, and an output wherein said flip-flop inverted data output is coupled to said variable delay circuit input, at least one select bit is coupled to said at least one select input, and said variable delay circuit output is coupled to said exclusive-OR second input, such that said exclusive-OR output provides a second clock signal having twice the frequency of said first clock signal and a duty cycle indicative of said at least one select bit.

5. A method of generating a clock signal having twice the frequency of a first clock signal, comprising:

generating a delayed version of said first clock signal having substantially the same frequency as said first clock signal by variably delaying said first clock signal; and logically combining said first clock signal with said delayed version of said first clock signal to generate said clock signal having twice the frequency of said first clock signal.

6. A duty cycle clock circuit comprising:

a logical circuit having first and second input terminals, and an output terminal, said first input terminal receiving an input clock signal having an input frequency; and a programmable delay circuit having a clock input terminal, a duty cycle select input terminal; and an output terminal, said clock input terminal coupled to said logical circuit output terminal, said duty cycle select input terminal receiving a duty cycle value, and said programmable delay circuit output terminal being coupled to said logical circuit output terminal provides an output clock signal having an output frequency approximately twice the input frequency, and an output duty cycle determined by said programmed duty cycle value.

7. The duty cycle clock circuit according to claim 6, wherein said programmable delay circuit further comprises a variable delay circuit including said primary delay element and being responsive to said programmed duty cycle value, for varying the delay of a signal between said first memory element inverted data output terminal and said logical circuit second input terminal such that said output clock signal duty cycle is varied.

8. The duty cycle clock circuit according to claim 7, wherein said variable delay circuit comprises a plurality of secondary delay elements selectably coupled, in response to said programmable duty cycle value, to said primary value, to said primary delay element and between said memory element inverted data output terminal and said logical circuit second input terminal.

9. The duty cycle clock circuit according to claim 7, said primary delay element having an input terminal and an output terminal, said primary delay element input terminal coupled to said first flip-flop inverted data output terminal, wherein said variable delay circuit comprises:

a plurality of secondary delay elements organized according to sequentially increasing delay times, and individually having an input terminal coupled to said primary delay element output terminal, and an output terminal; and a multiplexer circuit coupled to said primary delay element output and said plurality of secondary delay element output terminals, for passing an output signal from a selected one of said primary delay element and said plurality of secondary delay elements to said logical circuit second input terminal in response to a programmed duty cycle value.

10. The duty cycle clock circuit according to claim 8, further comprising a plurality of memory elements having a data input terminal, a clock input terminal, and an output terminal, wherein said data input terminal receives a control bit from a system bus, and said clock input terminal receives a first clock signal such that a duty cycle value is generated at said plurality of memory element output terminals.

* * * * *